(12) United States Patent
Haba et al.

(10) Patent No.: US 6,675,469 B1
(45) Date of Patent: Jan. 13, 2004

(54) VAPOR PHASE CONNECTION TECHNIQUES

(75) Inventors: Belgacem Haba, Cupertino, CA (US); John W. Smith, Palo Alto, CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 09/636,790

(22) Filed: Aug. 11, 2000

Related U.S. Application Data

(60) Provisional application No. 60/148,233, filed on Aug. 11, 1999.

(51) Int. Cl.[7] .............. H05K 3/36; H05K 3/02; H01K 3/10
(52) U.S. Cl. .............. 29/830; 29/846; 29/852; 29/853
(58) Field of Search .............. 29/830, 831, 846, 29/852, 853; 227/180.21, 245, 254; 427/96–99

(56) References Cited

U.S. PATENT DOCUMENTS

| | | |
|---|---|---|
| 3,077,511 A * | 2/1963 | Bohrer et al. ............ 174/265 |
| 3,508,589 A | 4/1970 | Derick et al. |
| 3,562,009 A | 2/1971 | Cranston et al. ............ 117/227 |
| 3,752,974 A | 8/1973 | Baker et al. |
| 3,771,026 A * | 11/1973 | Asai et al. ............ 148/DIG. 1 |
| 4,237,606 A * | 12/1980 | Niwa et al. ............ 174/262 |
| 4,573,766 A | 3/1986 | Bournay, Jr. et al. |
| 4,788,766 A * | 12/1988 | Burger et al. ............ 156/252 |
| 4,933,045 A | 6/1990 | DiStefano et al. ............ 156/630 |
| 5,148,265 A | 9/1992 | Khandros et al. ............ 357/80 |
| 5,148,266 A | 9/1992 | Khandros et al. ............ 357/80 |
| 5,239,746 A | 8/1993 | Goldman ............ 29/840 |
| 5,282,312 A | 2/1994 | DiStefano et al. ............ 29/830 |
| 5,312,569 A | 5/1994 | Mezei |
| 5,347,159 A | 9/1994 | Khandros et al. ............ 257/692 |
| 5,367,764 A | 11/1994 | DiStefano et al. ............ 29/830 |
| 5,407,864 A | 4/1995 | Kim ............ 437/203 |
| 5,454,161 A | 10/1995 | Beilin et al. ............ 29/852 |
| 5,499,912 A | 3/1996 | Mezei |
| 5,518,964 A | 5/1996 | DiStefano et al. ............ 437/209 |
| 5,536,909 A | 7/1996 | DiStefano et al. ............ 174/261 |
| 5,584,956 A | 12/1996 | Lumpp et al. ............ 156/272.2 |
| 5,589,668 A | 12/1996 | Yamaguchi et al. ............ 174/266 |
| 5,590,460 A | 1/1997 | DiStefano et al. ............ 29/830 |
| 5,614,114 A * | 3/1997 | Owen ............ 219/121.66 |
| 5,639,686 A * | 6/1997 | Hirano et al. ............ 438/381 |
| 5,675,889 A * | 10/1997 | Acocella et al. ............ 228/180.21 |
| 5,688,565 A * | 11/1997 | McMillan et al. ............ 427/294 |
| 5,746,868 A * | 5/1998 | Abe ............ 156/247 |
| 5,787,581 A | 8/1998 | DiStefano et al. ............ 29/884 |
| 5,904,498 A | 5/1999 | Fjelstad ............ 438/106 |
| 5,915,752 A | 6/1999 | Di Stefano et al. ............ 29/827 |
| 6,040,618 A * | 3/2000 | Akram ............ 257/586 |

FOREIGN PATENT DOCUMENTS

| WO | WO 94/03036 | 2/1994 |
| WO | WO 97/11588 | 3/1997 |
| WO | WO 98/26476 | 6/1998 |

OTHER PUBLICATIONS

JP 64–22097, Hitachi Chem Co. Ltd., Jan. 25, 1989.
JP 1–312895, Fujitsu Ltd., Dec. 18, 1989.

* cited by examiner

Primary Examiner—Carl J. Arbes
Assistant Examiner—Thiem D Phan
(74) Attorney, Agent, or Firm—Lerner, David, Littenberg, Krumholz & Mentlik, LLP

(57) ABSTRACT

Electrical connections are made between a pair of elements disposed on opposite side of the hole extending through a dielectric layer by evaporating a conductive material such as a metal having high vapor pressure within the hole while maintaining the hole in a substantially sealed condition. The process may be performed simultaneously to form numerous connections within a microelectronic unit as, for example, within a multilayer circuit panel.

49 Claims, 6 Drawing Sheets

VAPOR PHASE CONNECTION TECHNIQUES

CROSS-REFERENCE TO RELATED APPLICATIONS

The present application claims benefit of U.S. Provisional Patent Application No. 60/148,233, filed Aug. 11, 1999, the disclosure of which is hereby incorporated by reference herein.

FIELD OF THE INVENTION

The present invention relates to microelectronic components and fabrication of microelectronic components.

BACKGROUND OF THE INVENTION

Numerous microelectronic components incorporate insulating or "dielectric" layers and conductors extending through such layers. The directions along the surfaces of the layers are commonly referred to as "horizontal" directions, whereas the direction through the layers is commonly referred to as the "vertical" or "z" direction. The conductors extending through the layers are commonly referred to as z-direction conductors or "vias". For example, a multilayer microelectronic circuit panel may include several dielectric layers. Each dielectric layer has conductors extending along one or both surfaces of the layer in horizontal directions and has vias extending through the layer to connect certain conductors on opposite sides of the panel with one another. Typically, such a multi-layer circuit is fabricated by a sequential process. Each dielectric layer is deposited on previously-formed dielectric layers and the processes needed to form the vias and the horizontal conductors are performed. Such a sequential build-up process suffers from numerous drawbacks, including significant loss of productivity caused by quality problems. If any defect occurs in formation of a later layer, the entire multi-layer structure must be discarded.

As taught in certain preferred embodiments of commonly assigned U.S. Pat. Nos. 5,367,764 and 5,282,312, multilayer circuit panels can be fabricated using a parallel processing approach. In this approach, the various panels constituting the multi-layer structure are fabricated separately and then stacked together with interposers incorporating a curable dielectric material such as an epoxy and also incorporating masses of electrically conductive joining material such as solder extending through the interposer at predetermined locations. The stacked assembly is then cured as, for example, under heat and pressure. The dielectric material joins the circuit panels to one another and the electrically conductive material forms conductive pathways between conductors on the various panels. Because the individual panels can be tested prior to assembly, defects in the panel manufacturing process do not result in loss of the entire assembly. Also, as further explained in the aforementioned '764 and '312 patents, the individual panels can be selectively treated so that vertical connections between panels are made only at certain locations.

Other processes involving parallel production of multiple circuit panels and assembly in a stack are taught in certain preferred embodiments of co-pending, commonly assigned PCT Application PCT/US97/23948, published as International Publication WO 98/26476 and U.S. Pat. No. 5,590,460. As taught in certain preferred embodiments of the '460 patent and '948 PCT application, multiple circuit panels can be stacked and electrically interconnected with one another and mechanically engaging features on the circuit panels with features of conductive elements carried on interposer layers.

These approaches offer useful solutions to the encountered in fabrication of multi-layer problems. However, even with these improvements, the circuit panels typically still include vias extending through dielectric layers. Such vias commonly are formed by providing holes in the dielectric layers and depositing a conductive metal in the dielectric layers by processes such as electroless plating and electroplating. These processes work well with relatively large vias. However, it would be desirable to provide smaller vias so as to make the entire assembly more compact. It is difficult to form relatively small vias, such as circular vias having diameters less than about 60 microns and, more particularly, less than about 25 microns by plating.

Various proposals have been advanced for depositing conductive materials into holes to form vias by techniques other than plating. Cranston, et al., U.S. Pat. No. 3,562,009 shows a process for forming "metalized through-holes" by positioning a metallic element at a lower surface of a substrate having a hole formed therein and directing a laser beam or electron beam from above the substrate through the open top end of the hole onto the metal, thereby evaporating the metal onto the walls of the hole. In other embodiments, this reference discloses directing a similar beam onto a mass of powdered material disposed within the hole. This method suffers obvious drawbacks as a production technique, including the need to direct a powerful beam sequentially onto various locations on the substrate and hold the beam at each location for a time sufficient to vaporize the material. Moreover, this method is useful only to process a single substrate at a time. Beilin, et al., U.S. Pat. No. 5,454,161 discloses metal organic chemical vapor deposition ("MOCVD") of metal into openings of a dielectric layer. In the MOCVD process, the substrate is held in the reaction chamber so that openings of the holes are exposed to the interior of the reaction chamber. A metal-containing gaseous composition is introduced into the chamber. The composition decomposes to deposit metal in the open vias. Yamaguchi, et al., U.S. Pat. No. 5,589,668, discloses a similar process using vapor deposition methods such as evaporation, ion plating, or sputtering. In all of these processes, the substrate is held within a chamber so that openings of the vias are open to the interior of the substrate. Each substrate must be held within a relatively complex and expensive treatment apparatus for a time sufficient to build up the required metallic layer within its vias. Moreover, stacked substrates cannot be treated. U.S. Pat. No. 4,933,045 refers to metalization of vias by "evaporation, sputtering or plating" as assertedly "well-known in the art" but does not offer further details of such processes. Despite these attempts to use vapor deposition for forming vias, there is still need for better useful and economical vias-forming process.

Another common problem encountered in fabrication of microelectronic assemblies is mounting and connecting one component to another. For example, a semiconductor chip or other microelectronic device typically must be connected to a circuit panel. As described in certain preferred embodiments of commonly assigned U.S. Pat. Nos. 5,148,265, 5,148,266 and 5,347,159, the contacts of a semiconductor chip may be electrically connected to terminals on a small circuit panel or connection component overlying a face of the chip itself. The terminals on the connection component in turn are connected to contact pads on a substrate such as a circuit panel. Desirably, the connection component is movable with respect to the chip to accommodate dimensional changes caused by thermal effects during manufacture and/or use. The connections between the chip contacts and the interposer can be made by various methods. For example, these connections can be made by wire-bonding or by techniques such as thermosonic or ultrasonic bonding of pre-fabricated leads on the interposer to the chip contacts. Further improvements in lead bonding are taught, for example, in U.S. Pat. Nos. 5,536,909, 5,787,581 and PCT International Publication 94/03036. These processes provide marked improvements in chip connection processes and in the resulting assemblies.

In a process known as flip-chip bonding, contacts on the chip are bonded directly to contact pads on a substrate such as a circuit board using solder balls. All of the contacts of the chip may be connected simultaneously. However, flip-chip bonding requires considerable spacing between contacts on the chip to accommodate the solder balls and suffers from other drawbacks including susceptibility to thermal stresses.

As described in U.S. Pat. No. 5,518,964, numerous connections on a semiconductor chip or wafer can be made simultaneously by superposing an element such as a dielectric substrate having leads thereon with the chip or wafer bonding tip ends of the leads to the contacts on the chip and moving the element away from the chip or wafer so as to deform the leads. The resulting structure provides compensation for thermal effects and provides a high-reliability interconnection with the chip. Nonetheless, it would be desirable to provide even further improvements in methods for connecting components to one another.

Kim, U.S. Pat. No. 5,407,864 proposes mounting a chip on one surface of a circuit panel so that the contacts of the chip face down onto a top surface of a circuit board. The contacts on the chip are aligned with through-holes extending through the circuit board, to the bottom surface thereof. A metal is deposited through the openings of the through-holes at the bottom surface, as by sputtering, screening, electroplating or evaporation, so that the deposited metal forms conductive extensions of the chip contacts extending through the holes to conductors on the circuit board. This method suffers from the obvious drawback that holes must extend through the circuit board at each chip contact location. This, in turn, makes it impractical to mount a chip onto a multi-layer circuit panel. Moreover, where the process is performed using an evaporative technique, the structure, including the chip and the circuit panel must be retained in the evaporation apparatus for the full time required to deposit the metal. Additionally, the resulting structure has no ability to take up differential expansion and contraction between the chip and the circuit panel. Thus, despite all of the effort in the art presented by the aforementioned patents and publications, further improvements in via formation and connection techniques would be desirable.

SUMMARY OF THE INVENTION

One aspect of the present invention provides a method of making connections in a microelectronic unit. A method according to this aspect of the invention includes the step of providing first and second conductive elements and a dielectric so that the dielectric and the conductive elements cooperatively define a substantially closed chamber. A dispersible conductive material, such as a metal having appreciable vapor pressure is also provided within the chamber. For example, low-melting metals such as tin, gallium, silver, indium and alloys thereof may be used. Other low-melting alloys include alloys containing one or more of tin, bismuth and antimony. The method further includes the step of dispersing the conductive material within the substantially closed chamber so that the conductive material deposits on the dielectric and forms a connector extending between the conductive elements. Most preferably, the step of dispersing the conductive material is performed by evaporating the conductive material within the chamber. The chamber desirably is maintained under subatmospheric pressure. Alternatively or additionally, the atmosphere within the chamber may consist essentially of one or more inert gases, most preferably argon. The dielectric, the conductive elements or both maintain the chamber substantially isolated from the surroundings during the dispersing step, so that the dispersing step occurs without appreciable transfer of the conductive material into the chambers during the dispersing step. Stated another way, the conductive material already present within the substantially closed chambers is dispersed in situ. Most preferably, the substantially closed chamber is sealed gas-tight by the conductive elements, the dielectric or both.

The step of providing first and second conductive elements and a dielectric may include providing a dielectric layer having oppositely directed first and second surfaces and having one or more holes extending through the layer between the surfaces, and providing the first and second conductive elements so that they overlie the hole on the first and second surfaces of the dielectric layer. For example, the first conductive elements, the second conductive elements or both may be provided on separate bodies bearing these elements. These bodies may be laminated onto the dielectric layer, thereby forming one or more chambers as discussed above. The conductive material may be provided on the conductive elements as, for example, by depositing the conductive material through one or more techniques such as electroplating, electroless plating, sputtering, evaporation and chemical vapor deposition.

Once the chamber or chambers is or are closed, the process of evaporation simply requires maintaining the assembly at a suitable temperature for a sufficient time to allow the conductive material to redistribute itself within the chambers by evaporation. The assembly may be maintained under an external, surrounding subatmospheric pressure as, for example, by holding the assembly within a temporary housing or storage bin held at subatmospheric pressure so as to minimize mechanical stress on the assembly and minimize diffusion into the chamber or chambers. However, there is no need to maintain the assembly within specialized processing apparatus during the evaporation process. The evaporation process may occur, for example, within a simple oven or holding fixture.

Numerous connections can be formed simultaneously using these methods. For example, hundreds or thousands of connections can be formed between individual conductive elements of an assembly during a single evaporation step. The process is inherently reliable; provided that the conductive material is present and the conductive elements are exposed to the interior of the chamber, the conductive material will form a conductor connecting the conductive elements. Moreover, the evaporation process can be repeated after the assembly is tested to repair any defects detected during testing operation. If an assembly has defects, the assembly is simply recycled into the heating step, without further processing. Unlike conventional via-forming processes such as electroplating, the process according to this aspect of this invention works best with small holes. For example, holes having cross-sectional dimensions on the order of 60 micrometers or less, and more preferably 25 micrometers (about 0.001 inches) or less may be used successfully. The process thus lends itself well to fabrication of extremely compact, high density circuits.

A further process according to this aspect of the invention includes the step of providing a first dielectric layer having first and second surfaces and having a plurality of holes extending through such layer between the first and second surfaces and providing first conductive elements adjacent the first surface and second conductive elements adjacent to second surface so that these conductive elements are aligned with at least some of the holes. For example, the step of providing the first conductive element may include providing a first body having the conductive elements thereon juxtaposed with first surface of the dielectric layer. The second conductive elements may be provided on a similar, second body juxtaposed with the second surface of the dielectric layer. A method according to this aspect of the invention desirably further includes the step of providing a conductive material in at least some of the holes which have the first and second conductive elements aligned therewith and dispersing the conductive materials, preferably by evaporating the conductive materials, so as to form conductors interconnecting the first and second conductive elements which are aligned with at least some of the holes.

The process can be used to provide connections to a semiconductor chip or other microelectronic element having contacts on a front surface. Thus, the first body used in the aforementioned process may be a chip, an assemblage of plural discrete chips or an integral wafer incorporating numerous semiconductor chips. The dielectric layer may be provided on the contact-bearing front surface of the chip, assembly or wafer as by applying a curable adhesive to the front surface and bonding a preformed dielectric layer onto the adhesive or by applying the dielectric layer as a coating and curing and curing the coating. The holes may be formed in the dielectric layer in alignment with the contacts either before or after applying the dielectric later to the front surface. In this arrangement, the contacts on the microelectronic element serve as the first conductive elements. The second conductive elements may be provided on a circuit panel or other mounting substrate. In certain embodiments, the second conductive elements may include elongated conductors having fixed ends and free ends. The fixed ends are aligned with at least some of the hole sin the dielectric element. The free ends of the leads may be displaceable relative to the dielectric layer so that a second microelectronic element may be attached to the free ends of the elongated conductors and moved away from the dielectric layer so as to deform the conductors. Alternatively, the dielectric layer may include elongated lead regions having fixed ends and having free ends displaceable with respect to the remainder of the dielectric layer. At least some of the conductors desirably extend along these elongated lead regions so that the free end of each such elongated conductor is disposed adjacently free end of an associated lead region. Here again, a further microelectronic element may be assembled to the free ends of the leads and moved away from the first microelectronic element and dielectric layer to deform the leads. As further discussed below, such processes can provide semiconductor chip packages and mountings with the ability to take up relative movement caused by thermal effects.

At least one of the steps of providing first conductive elements, providing second conductive elements, and providing conductive material may be performed selectively so that the first conductive element, the second conductive element, or the conductive material is omitted at least some of the holes and hence no connection is made between first and second conductive elements at those holes. The process therefore can be used to form connections selectively. As discussed below, selective formation of conductive elements and/or selective application of conductive material can be achieved readily using known techniques such as selective plating or etching, screen printing and selective vapor deposition, as for example, using a mask to block vapor deposition in areas where deposition is not wanted.

According to a further variant, the process may incorporate the step of providing a stacked structure including one or more dielectric layers and plural layers of conductive elements separated from one another by these one or more dielectric layers. At least some of the conductive elements in different layers are aligned with one another at one or more sites and the dielectric layers have holes extending through them between the aligned conductive elements at at least some of the sites. Here again, a dispersible conductive material such as the aforementioned high-vapor pressure metals is supplied at at least some of the sites. After the stacked structure has been made, the conductive material is evaporated onto the walls of the holes in the dielectric layers to thereby form vertical connections between conductive elements. The conductive metal may be evaporated within holes in all of the stacked layers simultaneously.

The vertical connections are formed at only those sites where the conductive elements are aligned with one another; where the dielectric layer which is disposed between these aligned conductive elements has a hole in alignment with the conductive element and where the conductive material is provided. This method is particularly well-suited to manufacture of multi-layer circuitry. Thus, the one or more dielectric layers typically includes numerous dielectric layers. The vertical conductors extending through the stacked structure can be provided selectively by conducting any one of several steps selectively. For example, the step of providing holes in the dielectric layers may be performed selectively so that holes are provided at less than all of the sites. The holes may be disposed at locations of a regular grid pattern, but less than all of such locations may be provided with holes. Also, the step of applying the evaporable conductive material may be performed selectively. For example, where the conductive material is applied onto the conductive elements before stacking as, for example, where the conductive material is applied by plating, the conductive material may be applied selectively by masking areas where conductive material is not wanted before plating or by selectively etching away the conductive material using an etchant which does not attack the conductive elements substantially. Stated another way, the operations required to provide conductive material in a selective manner to less than all of the sites may involve only conventional procedures commonly used for applying metals in a controlled fashion in microelectronic circuit processing.

The layers of conductive elements may include first direction and second direction layers arranged in alternating order. The conductive elements in each first direction layer include elongated traces extending predominantly in a first horizontal direction whereas the conductive elements in each second direction layer have elongated traces extending predominantly in a second horizontal direction transverse to the first horizontal direction. The holes are desirably arranged at at lest some locations of a regular grid pattern corresponding to crossing points of the first direction and second direction traces. Such an arrangement provides complete flexibility in layout of the circuit. Moreover, because very small vias can be employed, there is no need to provide enlarged features at the crossing points.

In further variants, the conductive material may be dispersed within the chambers by processes which do not entail evaporation as, for example, by applying sonic energy to atomize the conductive material in a liquid state or to mechanically spread the liquid conductive material. Here again, the process desirably does not rely upon filling of the chamber or via with liquid. In still other variants, a conductive material precursor is provided within the closed chambers and reacts to form a conductive material within the closed chambers.

DETAILED DESCRIPTION OF THE PREFERRED EMBODIMENTS

Figure 1:
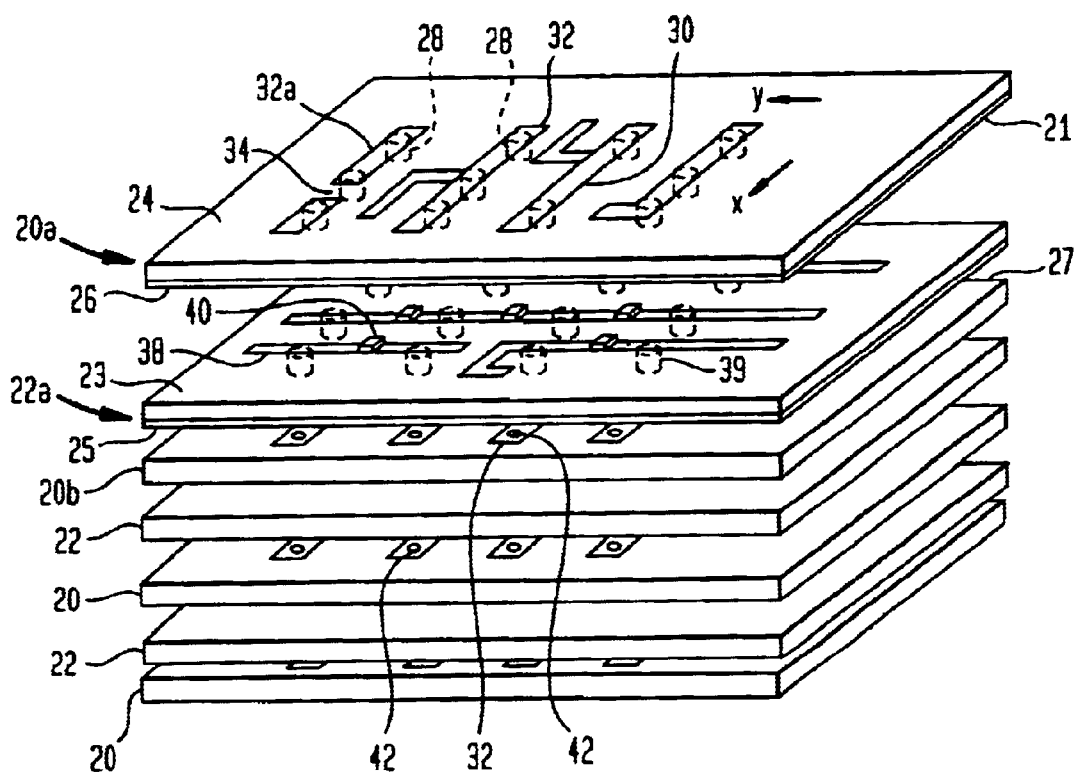
FIG. 1 is a diagrammatic perspective view depicting certain components used n one embodiment of the invention.

A process in accordance with one embodiment of the invention utilizes a set of bodies 20 of a first type and bodies 22 of a second type. Each body 20 includes a sheet-like dielectric layer having a top surface 24 and an oppositely directed bottom surface 26. In the particular embodiment illustrated, each layer 20 is formed from a sheet of polyamide approximately 25–100 microns thick. Each of the bodies or layers 20 has a coating or sublayer 21 of a heat-curable bonding material on its bottom surface. Bonding material layer 21 may be integral with body or layer 20 or else may include a distinct adhesive differing in composition from the remainder of the body or layer 20. Suitable adhesives include those commonly used in manufacture of laminated flexible circuits for high-temperature service, such as polyamides, epoxies and cyanate-PTFE materials.

Each layer 20 also has holes 28 extending through it, from its top surface 24 to its bottom surface 26. These holes are arranged at locations of a regular, rectilinear grid pattern having columns of holes extending in a first or x horizontal direction and having rows of holes extending in a second or y horizontal direction orthogonal to the first or x-direction. The holes need not be provided at every location of the regular grid pattern. For example, one hole is omitted at a location 30 within the grid pattern. Although only a few holes are depicted in FIG. 1 for clarity of illustration, in practice a typical layer may have tens, hundreds or thousands of holes and may have omitted holes at many locations of the regular grid patterns.

Figure 2:
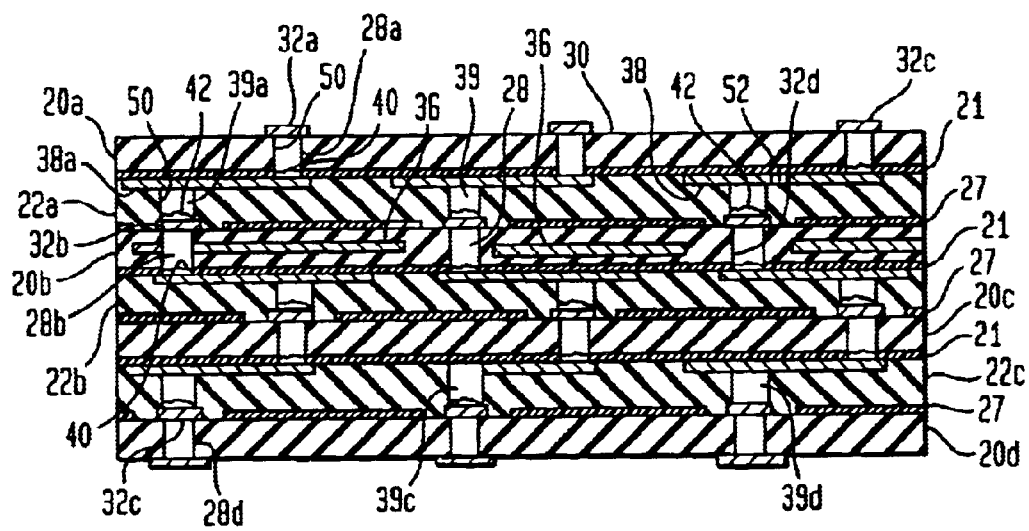
FIG. 2 is a diagrammatic sectional view depicting the components of FIG. 1 during an assembly procedure in accordance with one embodiment of the invention.
Figure 3:
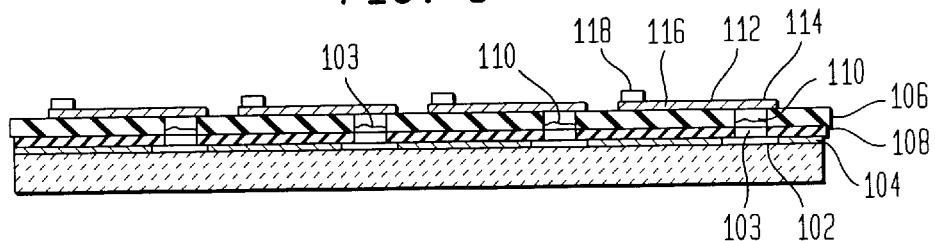
FIG. 3 is a diagrammatic sectional view depicting components in accordance with a further embodiment of the invention.
Figure 4:
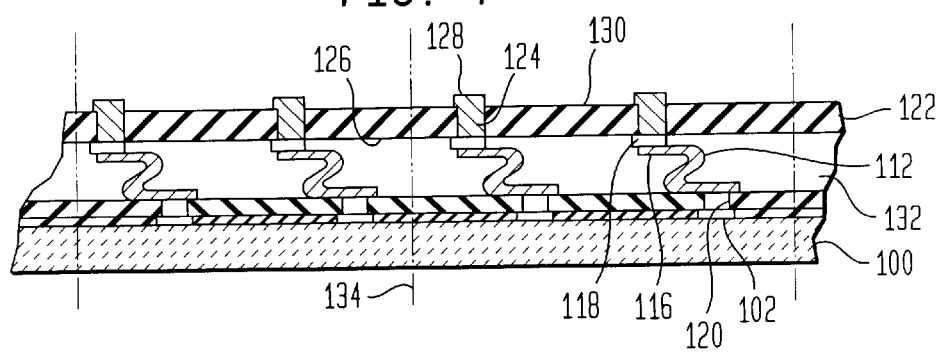
FIG. 4 is a diagrammatic sectional view depicting the components of FIG. 3 in conjunction with another element during a later step of the process.

Desirably, each hole is less than about 60 microns in diameter, more preferably less than about 25 microns in diameter and most preferably about 12.5 microns in diameter or less. The dielectric layers 20 may be solid dielectric. Alternatively, some or all of the dielectric layers in bodies 20 may incorporate conductive elements disposed in the interior of the dielectric layers. For example, body 20b includes an internal electrically conducive potential plane 36 disposed between the top and bottom surfaces of the dielectric layer. As shown in FIG. 2, potential plane 36 is isolated from most of the holes 28 in this layer. However, the potential plane 36 extends to one or a few holes 28b in layer 20b. As explained below, conductive layer will form connections to a vertical via at hole 28b.

Each layer 20 also includes traces 32 extending along the top surface of the layer. The traces 32 on bodies 20 extend predominantly in the first or x direction, although some portions of the traces extend in other directions as well. Here again, the trace pattern is greatly simplified for clarity of illustration. A typical pattern of traces will include hundreds of traces. Also, traces may be broken or continuous. For example, trace 32a has a break 34 at one location. At least some of the traces 32 extend over the top ends of holes 28. Stated another way, the traces extend over locations of the regular grid pattern of the holes.

The holes and traces can be formed by essentially any conventional technique used in fabrication of microelectronic circuit panels. For example, the traces can be formed by subtractive etching from a sheet of copper or other conductive metal overlying the top surface of the body by using a photoresist or other patternable masking material to control the etchant process and leave the undesired traces. Alternatively, the traces can be formed by conventional additive plating. The holes may be formed by laser ablation or chemical etching of the dielectric layer again using a photoresist or other mask. Alternatively, the dielectric layer itself may be formed from a photosensitive dielectric and the holes may be formed by selective exposure and curing of the dielectric.

Dielectric bodies 22 of the second type are essentially the same as bodies 20. Each body 22 has a top surface 23, a bottom surface 25, and a curable bonding material 27 on its bottom surface 25. Each body 22 has holes 39 extending through it. The traces or conductors 38 on layers 22 extend predominantly in the second or y horizontal direction. Spots of a high vapor pressure conductive metal 40 are disposed on the top surfaces of traces 38. Similar spots of conductive metal 42 are disposed on the top surfaces of the traces 32 of first-direction layers 20. The spots 40 and 42 are disposed in regular grid patterns with spacing in the first and second horizontal directions equal to the spacing used in the regular grid pattern of the holes. The spots of high vapor pressure conductive material are omitted from body 20a, which will form the top layer in the stack.

In an assembly process according to one embodiment of the invention, bodies 20 having leads extending in the first or x direction are stacked in alternating order with bodies 22 having traces extending in the second or y direction. The grid of conductive material spots 40 on each second-direction body 22 is aligned with the grid of holes 28 in the next higher first-direction layer 20 in the stack. For example, the grid of conductive material spots 40 on second-direction layer 22a is aligned with the grid of holes 28 in the next higher layer 20a. Similarly, the grid of conductive material spots 32 on first-direction layer 20b is aligned with the grid of holes 39 in the overlying second-direction layer 22a. The layers are disposed in a vacuum lamination apparatus having an enclosed chamber and having a pair of opposed platens inside the chamber. The chamber is flushed with an inert gas and brought to a substantial vacuum. This process is repeated to assure that the holes in all of the layers have been substantially flushed with the inert gas, and then the chamber is brought to a lower, subatmospheric pressure desirably about 200 Torr or less and more desirably about 10 Torr or less. Still lower pressures, of about 1 Torr or less can be used. During the flushing and the evacuation process, the layers may be held apart from one another by temporary spacers (not shown) to assure good communication between each of the holes and the surrounding atmosphere within the chamber. Alternatively, the flushing and the evacuation process can be performed before the layers are stacked on one another.

After the flushing and evacuation procedure, the layers are laminated to one another under heat and pressure applied by squeezing the layers between the platens. The bonding materials 21 and 27 on the bottom surfaces of layers 20 and 22 are activated so as to bond the layers to one another and close the holes 28 and 39 in the various layers. Thus, after the lamination step, hole 39a has a first conductive element (trace 32b on layer 20b); a second conductive element (trace 38a at the top surface of layer 22a) and a dielectric (the dielectric of layer 22a) cooperatively defining a substantially closed, sealed chamber, and has a conductive material 42 disposed within such chamber. The same arrangement is present at at least some of the other holes 39 and 28. Desirably, the joints between the layers are gas-tight, so that each hole is sealed. At this point, the atmosphere within each hole consists essentially of inert gas at a low subatmospheric type of pressure corresponding to the pressure used in the vacuum chamber during the lamination step.

After lamination, the assembly is maintained at an elevated temperature for a time sufficient to evaporate some or all of the metal in spots 40 and 42. The upper limit of the temperature used in this stage of the process should not exceed the degradation temperature of the materials constituting bodies 20. For example, typical polyamides degrade at temperatures of about 350–400° C. Also, the pressure within the sealed chambers defined within the bodies increases with temperature. The temperature used in this stage should not be so high as to raise the pressure above the pressure prevailing on the exterior of the laminate. Thus, the internal pressure within the sealed chambers should not exceed atmospheric pressure when the assembly is maintained under normal atmospheric pressure during this stage of the process. Where the bodies include organic polymers, the degradation temperature of the polymer normally controls. The evaporated metal deposits as a coating on the interior walls of holes 28 and 39, and forms electrically conductive vias or vertical, z-direction conductors 50 extending through the various layers at the holes. The vertical conductors join the conductive elements or traces bounding the various holes and thus forms vertical conductive paths through the stacked structure. For example, one such vertical conductive path extends almost entirely through the stack, from trace 32a at the top of layer 20a downwardly through hole 28a, hole 39a and so on through other holes to trace 32c at the top of the lowermost layer 20d. Where the bodies 20 and 22 incorporate internal conductive features extending to the holes, the conductive via liners 50 also form connections with such internal conductive features. For example, potential plane element 36 is electrically connected to the vertical conductor at hole 28b.

The vertical conductive paths are provided selectively. Thus, a vertical via or conductive path through an individual layer is provided only where three conditions are met: First, there must be a hole at such location; no path is formed at location 30 where a hole is omitted. Second, there must be traces or conductive elements adjacent both ends of the hole. For example, no trace overlies the top end of hole 39c in layer 22c near the bottom of the stack. Therefore, no vertical connection will be formed at this hole. Third, the evaporable conductive material must be present within the hole. For example, at hole 39d, no conductive material is provided and hence no vertical connection will be formed. Thus, the formation of vertical connections can be controlled by providing holes selectively; by providing conductive elements selectively and by providing the evaporable conductive material selectively, as well as by any combination of these measures. Additionally, the locations and extent of vertical and horizontal conductive pads through the stacked assembly can be controlled by selective formation or interruption of the traces or conductive pads along the surfaces of the bodies. For example, a break 52 in a trace 38 on the top surface of layer 22a electrically isolates trace 32c on the top surface of layer 20a from trace 32d on the top surface of layer 20b. Stated another way, customization of the traces on the individual layers can provide customization of vertical path formation even without selective formation of the vertical conductive themselves. The use of horizontal-conductor customization to provide selectivity in vertical path formation is described in greater detail in U.S. Pat. Nos. 5,282,312 and 5,367,764 the disclosures of which are hereby incorporated by reference herein.

To assure reliable connections between the conductive elements, the conductive elements should be substantially free of contaminants, particularly oxides, which may interfere with formation of a good, low resistance joint between the deposited conductive material and the conductive element or trace. Where the traces are formed from a reactive metal such as copper, they will typically have an oxide layer. The oxide layer can be removed by baking in a atmosphere having very low partial pressure of oxygen as, for example, by holding the bodies bearing the conductive elements in a vacuum chamber at an elevated temperature. These procedures are similar to the deoxidizing procedures employed for flux-free soldering. Alternatively or additionally, the reactive metal may be covered with a non-reactive metallic surface coating such as a gold layer. Typically, a gold layer is applied over a coating of nickel.

During the evaporation step, the assembly need not be maintained between the platens of the lamination process. Thus, each assembly can be laminated in a brief heating and pressing operation and then transferred to an oven for the evaporation operation. The assemblies can be handled in bulk in the evaporation operation, without need for any particular fixturing other than that required to avoid mechanical damage to the exterior surfaces of the assemblies. Therefore, large numbers of assemblies can be held in the evaporation operation. The process therefore can achieve substantial throughput even if the dwell time in the evaporation operation is substantial. Typically, dwell times from a few minutes to a few hours are sufficient to form the vertical conductors. Preferably, the evaporation operation is conducted in air at atmospheric pressure or even at superatmospheric pressure, so that the pressure outside of the laminate balances or exceeds the pressure developed inside the sealed chambers.

Alternatively, the evaporation operation can be conducted under subatmospheric pressure and in an atmosphere consisting essentially of an inert gas. This assures that even if an assembly has a leakage path to a particular hole, that hole will retain its low pressure, inert gas atmosphere. When this alternative is employed, the assembly may be held between platens to assure that excess internal pressure does not cause delamination. In a further alternative, the bodies and conductive elements may be provided with small openings so that the interiors of the chambers communicate with the exterior of the assembly during the evaporation operation. In this case, the evaporation operation should be conducted with an atmosphere surrounding the exterior of the assembly under a subatmosphereic total pressure. Even in this case, however, the chambers remain substantially closed, and the process is conducted without appreciable transfer of conductive material into the chambers from outside of the assembly, and typically without any transfer of conductive material into the chambers during the process of distributing the conductive material within the chambers.

In the process discussed above, the vertical conductors are formed in numerous layers simultaneously. However, the process can be varied so as to form vertical conductors in different layers seriatim. Thus, a first set of closed chambers can be formed by stacking a first set of parts, and the conductors can be formed in those chambers. Then, one or more additional layers are added to form further chambers, and the conductor-forming steps are repeated. This cycle of operations can be repeated add still more layers and form more conductors, until the desired number of layers have been added.

A process according to a further embodiment of the invention begins with a semiconductor wafer 100 having contacts 102 on a first or front surface. The wafer desirably also has passivation layer 104 overlying the front surface except at contacts 102. The wafer incorporates internal electronic devices (not shown) electrically connected to contacts 102.

Contacts 102 are treated to provide a good electrical connection with the material to be evaporated in later stages of the process and also to prevent undesired reactions between the conductive metal to be evaporated and the material of the contacts. For example, the zincated aluminum contacts may be covered with a layer of nickel followed by an over-coating of gold. Following this procedure, a high vapor pressure conductive metal 103 is applied onto contacts 102 using a conventional deposition process such as sputtering or evaporation. Desirably, a mask is used during the sputtering or evaporation process so that the conductive material is deposited only on contacts 102. Other methods of applying the high vapor pressure metal can be employed. For example, the high vapor pressure metal can be applied by depositing balls of the metal onto the contacts and melting the metal, using the same techniques as employed in application of conventional solder balls. Also, the high vapor pressure metal may be applied by contacting the front face of the wafer with the metal in liquid form, using a technique similar to wave soldering. The techniques taught in copending, commonly assigned U.S. Provisional Patent Application 60/123,602 the disclosure of which is hereby incorporated by reference herein for application of bonding materials such as solders can be used for application of the high vapor pressure materials. In yet another alternative, a separate substrate layer bearing the high vapor pressure material may be applied over the front face of the wafer.

In the next stage of the process, a dielectric layer 106 is laminated over the passivation layer 104. Layer 106 has an adhesive layer 108 similar to the adhesive layers discussed above on a bottom surface and has holes 110 extending through and between its top and bottom surfaces. Layer 106 also has elongated leads 112 on its top surface. Each lead has a first or fixed end 114 overlying one of the holes 110 and a free or tip end 116 remote from such hole. Each lead carries a bonding material 118 such as a solder, eutectic bonding alloy or the like. The tip end 116 of each lead desirably is releasably attached to the top surface of layer 106, whereas the fixed end 114 of each lead desirably is securely attached to layer 106. Lead structures suitable for this purpose are disclosed in commonly assigned U.S. Pat. Nos. 5,518,964; 5,904,498 and in co-pending, commonly assigned international application PCT/US/99/02748 and U.S. patent applications Ser. Nos. 09/020,750 and 09/195, 371 the disclosures of which are hereby incorporated by reference herein. For example, as disclosed in the aforementioned '498 patent, the lead sections may have differing bond strengths on different portions of the top layer. As set forth in certain preferred embodiments of the '518 patent and in certain preferred embodiments of the aforesaid PCT and US applications, the tip end of the lead may be connected to the supporting dielectric by a small metallic or dielectric element which can be broken or dislodged readily.

Layer 106 is laminated to wafer 100 using gas flush and vacuum lamination techniques similar to those discussed above in connection with formation of the stacked assembly. Thus, after lamination, the dielectric layer 106, with its cured adhesive layer 108 forms a gas-tight seal to the wafer. Each hole 110 is sealed by the dielectric layer, by the fixed end 114 of the overlying conductor 112 and by the wafer and contact 102 itself. Each holes contains an inert gas atmosphere at a low subatmospheric pressure as discussed above. Again, the assembly is held at an elevated temperature so as to evaporate the conductive material 103 from each contact 102 and to the interior of the hole 110 and thereby form a vertical connector extending between the contact and the fixed end 114 of the associated lead.

After the vertical conductors have been formed so as to connect leads 112 to the contacts 102 of the wafer, the wafer is engaged with a further element 122 having pads 124 exposed on a bottom surface 126. Merely by way of example, the further element may be a single-layer or multi layer stricture having terminals 128 exposed at the top surface 130. Pads 124 are bonded to the tip ends 116 of the leads by activating the bonding material 118 carried on the tip ends of the leads. Typically, the bonding material is activated by engaging the components under heat and pressure. After the tip ends of the leads have been bonded to the pads 124, element 122 is moved away from wafer 100 and away from dielectric layer 106 through a predetermined vertical displacement. These components may also move relative to one another in a horizontal direction. Movement of these components relative to one another bends the leads towards a vertically extensive disposition. During or after movement of the components, a flowable, curable composition is introduced between the components and cured to form a dielectric, desirably compliant layer 132 surrounding leads 122. For example, the curable material may be introduced under pressure between the components and may help to impel the components away from one another. Techniques for performing the lead bonding and movement operations are described in the aforementioned patents and publications.

The resulting assembly is then severed by cutting both component 122 and wafer 100 along cutting planes 134 so as to thereby form a plurality of individual units. Each unit includes one semiconductor chip or a few chips in the wafer and a portion of element 122. As described in greater detail in the aforementioned patents and publications, such a unit can be mounted on a substrate such as a printed circuit board with terminals 128 bonded to the substrate. Leads 112 can flex and compliant layer 132 can deform so as to permit differential thermal expansion of the chip and circuit board without imposing significant stresses on the solder joints between the terminals 128 and the circuit board. In other cases, the additional unit 122 itself may be a circuit board or other microelectronic device. The flexible leads and compliant layer provide similar benefits in these cases. The evaporation technique provides an effective, economical and reliable way of making connections between leads 112 and contacts 102. In a variant of this approach, conductive material 103 may be provided on the bottom surfaces of lead fixed ends 114, within holes 110, and evaporated so as to form connections to the contacts 102 of the chip. Also, bonding material 118 may be carried on pads 124 rather than on the tip ends of the leads.

Figure 5:
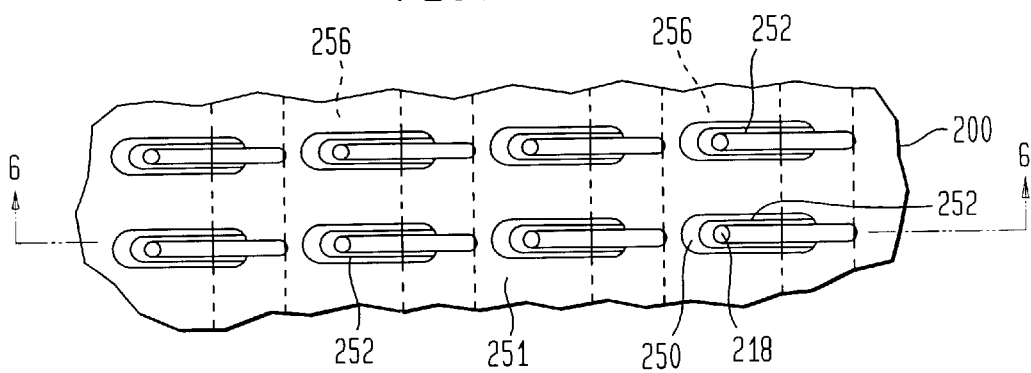
FIG. 5 is a diagrammatic top plan view depicting a component in accordance with yet another embodiment of the invention.
Figure 6:
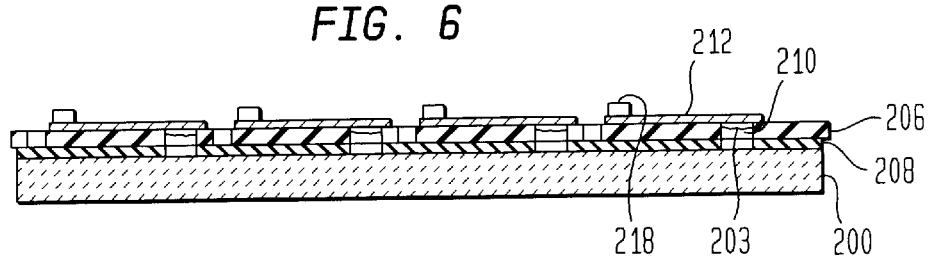
FIG. 6 is a diagrammatic sectional view taken along line 6—6 in FIG. 5.
Figure 7:
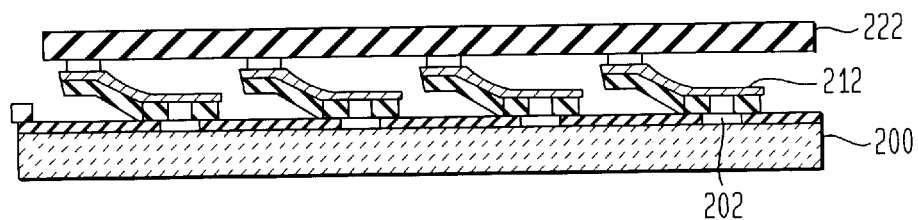
FIG. 7 is a view similar to FIG. 6 but depicting the component in conjunction with another element during a later stage of a manufacturing process.

In a further variant, (FIGS. 5–7) dielectric layer 206 has numerous generally U-shaped slots 250 extending through it and subdividing the dielectric layer into a main region 251 and a plurality of elongated lead regions 252. Holes 210 are formed in the main region 251 of the sheet adjacent to each lead region. Elongated conductors 212 extend from the main region of the sheet onto each lead region 252. Each such conductor overlies one hole 210 and has a bonding material 218 at the tip end of the lead region, remote from the main region. The conductive, evaporable material 203 is provided on the undersides of conductors 212, within holes 201. The adhesive layer 208 used to secure dielectric layer 206 to the front surface of wafer 200 is a UV-degradable or other radiation degradable adhesive material. The lamination and evaporation steps are performed in substantially in the same way as discussed above so as to form vertical conductors 220 connecting contacts 202 with conductors 212. Before, or more desirably, after the evaporation step, adhesive layer 206 is selectively degraded in regions 256 (FIG. 5) encompassing the tip ends of lead regions 252. Such selective degradation may be provided, for example, by selectively applying ultraviolet light or other radiation effective to degrade layer 206. The tip ends of the leads are bonded to a further element 222 by the conductive material carried on the tip ends. Here again, further element 222 and wafer 200 are moved away from one another so as to bend the leads towards a vertically extensive configuration. A curable material desirably is injected around the leads during or after the movement step. Components with lead regions, and assembly techniques for use with such components, are disclosed in copending, commonly assigned U.S. patent applications Ser. No. 09/140,589, filed Aug. 26, 1998, and U.S. patent application Ser. No. 09/317,675, filed May 24, 1999, the disclosures of which are hereby incorporated by reference herein. Other components which include leads with polymeric layers are disclosed in U.S. Pat. Nos. 5,915,752 and 5,536,909 the disclosures of which are hereby incorporated by reference herein, and the aforementioned PCT/US96/14965 application.

Figure 8:
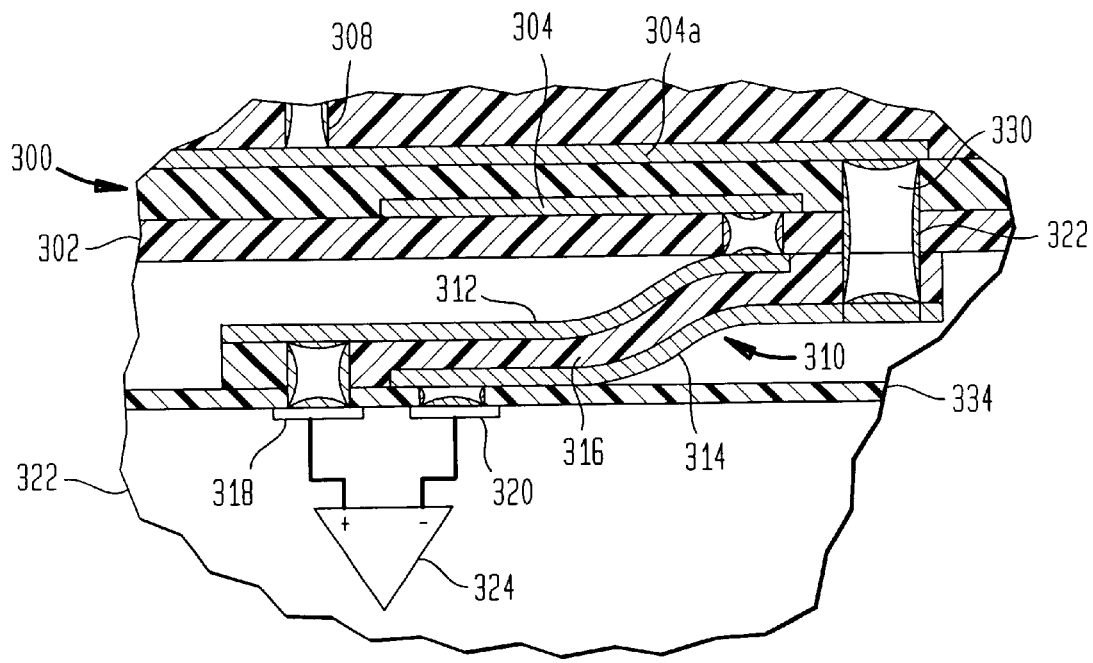
FIG. 8 is a fragmentary, diagrammatic sectional view depicting components in accordance with another embodiment of the invention.
Figure 9:
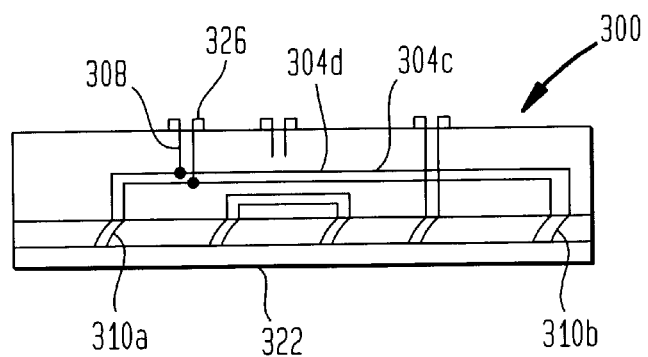
FIG. 9 is a diagrammatic elevational view of the components shown in FIG. 8.

As illustrated in FIGS. 8 and 9, the vapor phase connection method discussed above can be used to make more complex assemblies. Thus, a component 300 in accordance with another embodiment of the invention incorporates numerous dielectric layers 302 and traces 304 extending between these dielectric layers. Vertical conductors 308, desirably formed by the vapor-phase process as discussed below, extend through some or all of these layers. At least some of the traces 304 and vertical conductors 308 are arranged in pairs or sets. The bottom surface of body 300 has numerous leads 310. As best seen in FIG. 8, each lead 310 includes a plurality of conductors 312 and 314, as well as a dielectric layer 316 separating the conductors from one another. The conductors 312 and 314 are connected to contacts 318 and 320 of a semiconductor device 322 such as a chip or wafer. The contacts 318 and 320 connected to each lead desirably are adjacent one another and may be connected to the same internal electronic device 324 disposed within chip or wafer 322. As explained in greater detail in co-pending commonly assigned U.S. patent applications Ser. Nos. 09/140,589; 08/715,571 filed Sep. 19, 1996 and U.S. patent application Ser. No. 09/020,754 filed Feb. 9, 1998 and in PCT International Publication WO 97/11588, the disclosures of which are incorporated by reference herein, the use of traces and conductors arranged in pairs or sets of plural traces or conductors provides a controlled impedance signal path. For example, such a path may incorporate a signal conductor and a ground conductor extending generally parallel to one another, or may include a set of two or more signal conductors extending generally parallel to one another. As discussed in detail in these applications, a circuit 324 within the chip may be arranged to transmit or receive oppositely directed pulses on a set of adjacent contacts such as contacts 318 and 320, so that these pulses will be transmitted along the set of conductors 312 and 314 on the same lead and transmitted along juxtaposed, parallel traces such as traces 304a and 304b (FIG. 8). As further described in these applications and publications, such an arrangement provides rapid, reliable signal transmission. Also, the controlled impedance signal paths provided in this arrangement may be used to conduct signals between different elements of chip or wafer 322, i.e., to conduct signals within a single chip or wafer. For example, traces 304c and 304d and the associated leads 310a and 310b provide a low impedance signal path between two widely separated electronic devices within chip 322, as well as a path for conduction to external terminals 326. Provision of a low impedance signal path in turn allows rapid propagation of signals between widely separated elements of the chip and simplifies the task of routing signals within the chip. The ability of the present invention to form connections within small holes provides for a particularly compact assembly. As best seen in FIG. 8, the vertical conductors may be formed within holes of different sizes and types. For example, a vertical conductor 332 is formed within hole 330 extending through several polymeric layers, whereas another vertical conductor is formed at the hole overlying contact 320 and extends through only the thickness of passivation layer 334. In a further variant, multiple chips are connected to a single component, such as component 300, and interconnected by the conductors and leads to form a multi-chip module.

Figure 10:
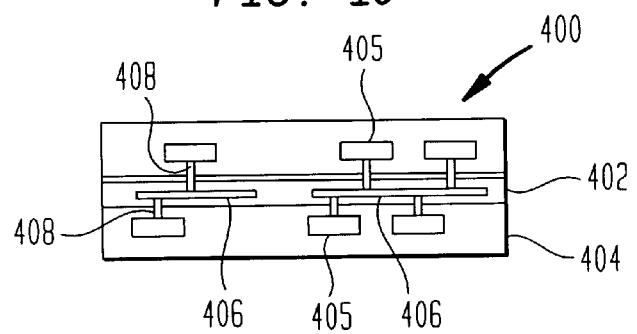
FIG. 10 is a diagrammatic elevational view depicting components in accordance with a further embodiment of the invention.

As seen in FIG. 10, the vapor phase connection process may be used within an assembly composed entirely of bodies formed from silicon or other semiconductor materials. Thus, a composite chip or wafer can be made by stacking chips 400, 402, and 404. Chips 400 and 404 may contain active semiconductor electronic devices 405, whereas the middle chip 402 may incorporate only insulating layers and conductors 406. Holes 408 in chip 402 may be aligned with contacts on the other chips and an evaporable conductive material may be evaporated within the holes in substantially the same way as described above. The process of evaporation may occur simultaneously with a process of fusion which binds the chips together and fuses the same into a solid unit. For example, such a process may occur at a relatively high temperature and may involve the fusion of silicon or other elements at the mating surfaces. Alternatively or additionally, such a fusion process may involve activation of a high-temperature adhesive or a eutectic bonding material.

Such a process can be used to fabricate assemblies of chips where each of the chips includes active device or, alternatively, where one or more of the chips includes only conductors and passive device. This is particularly useful where the production processes used to make the various chips are incompatible with one another. For example, traces 406 may formed from a metal such as copper, gold, platinum or other metals which are difficult to deposit in conventional semiconductor fabrication processes or which have deleterious effects on active devices when present in close proximity to the active devices. The vapor phase connection process serves to unite these conductors with electronic devices 405 in chips 400 and 404. Although the conductors 406 are electrically connected to the devices 405, the conductors remain isolated from the devices so that little or no diffusion of the conductor material into the devices occurs during fabrication or use. Stated another way, the connections formed by the vapor phase connection process maintain chemical isolation.

Alternatively or additionally, chips 400 and 404 may be formed by mutually incompatible processes or formed from mutually incompatible materials as, for example, where chip 400 is formed from a compound semiconductor such as a III–V compound, a II–VI compound, or other compound semiconductor and where chip 404 is formed principally from silicon. As used in this disclosure, the term "III–V" compound refers to a compound of any one or more of Al, Ga, In or Tl with any of N, P, As, Sb or Bi, whereas the term "II–VI compound" refers to a compound of any one or more of Be, Mg, Ca, Sr, Ba, Zn, Cd, and Hg with one or more of O, S, Se and Te. Typically, these compound semiconductors also include dopants. In a further variant, the middle chip 402 is eliminated and the entire stack consists of only two chips. One or both of these chips has holes and contacts aligned with the holes and the contacts on the two chips are joined to one another using an evaporable conductive material as described above. The ability of the vapor phase conductor forming process to provide small vias is particularly useful where these vias are to be formed within a chip itself A further advantage of using the present connection process to assemble plural layers of semiconductor material is that it allows parallel processing of the various layers. For example, one or more layers (typically layers incorporating active devices) may be formed using a very fine line width, whereas another layer or layers (typically incorporating only conductors and passive devices) may be fabricated with a coarser line width. This allows fabrication of the conductor layers using less expensive, more reliable and higher-yielding processes. Further, the ability to fabricate the layers separately allows for testing of the individual layers before assembly.

Figure 11:
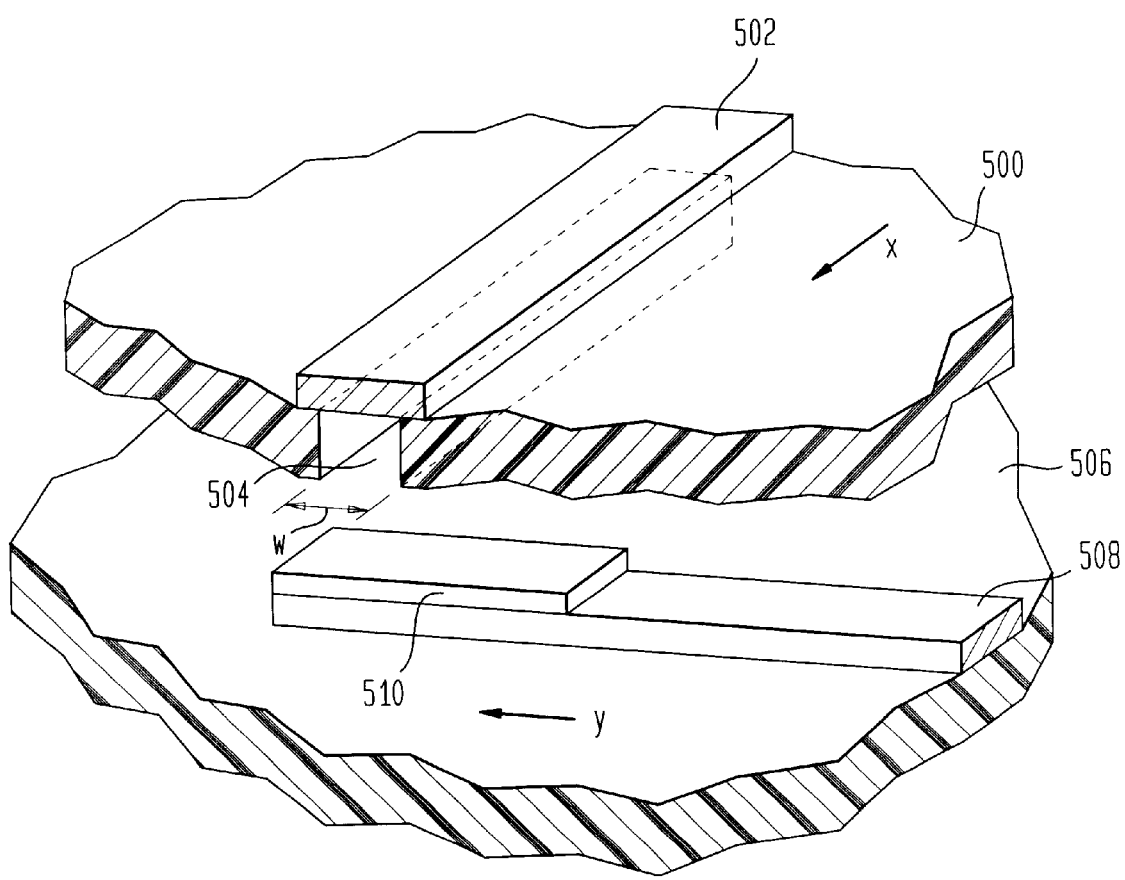
FIG. 11 is a fragmentary, partially-sectional perspective view depicting components in accordance with yet another embodiment of the invention.

As depicted in FIG. 11, an assembly according to a further embodiment of the invention includes a dielectric layer 500 having one or more conductors 502 disposed adjacent a top surface. These conductors extend predominantly in first or x direction. Dielectric element 500 has holes 504 in the form of elongated slots extending generally in the x direction beneath some portions of conductors 502. Another element such as a dielectric layer or body 506 has conductors 508 extending predominately in a second or y direction transverse to and desirably orthogonal to the first or x direction. Conductors 508 have elongated masses of conductive material 510 thereon. In the position illustrated in FIG. 11, bodies 500 and 506 are remote from one another. In a joining process, the bodies are engaged with one another in the same manner as described above and the conductive material 510 is evaporated so as to form a vertically extending conductor within each slot 504.

Use of elongated conductive elements and slots in this embodiment helps to assure that a reliable connection will be made even if one or both of the elements is slightly out of nominal positron. Thus, provided that any point on slot 504 is aligned with any region of lead 508 having the evaporable conductive material, the connection will be made. Misalignment in the first or x direction will simply move the connection slightly along the length of slot 504 and trace 502, whereas misalignment in the y direction will simply move the interconnection along the lead 508. Tolerance sensitivity can be further reduced by providing the evaporable conductive material within slot 504. In this case, so long as slot 504 intercepts some portion of lead 508, the connection will be made. As discussed above, the vapor phase connection process typically works best with relatively small holes. Thus, the minimum dimension or width w of the hole or slot 504 desirably is less than about 60 microns and more desirably 25 microns or less.

Figure 12:
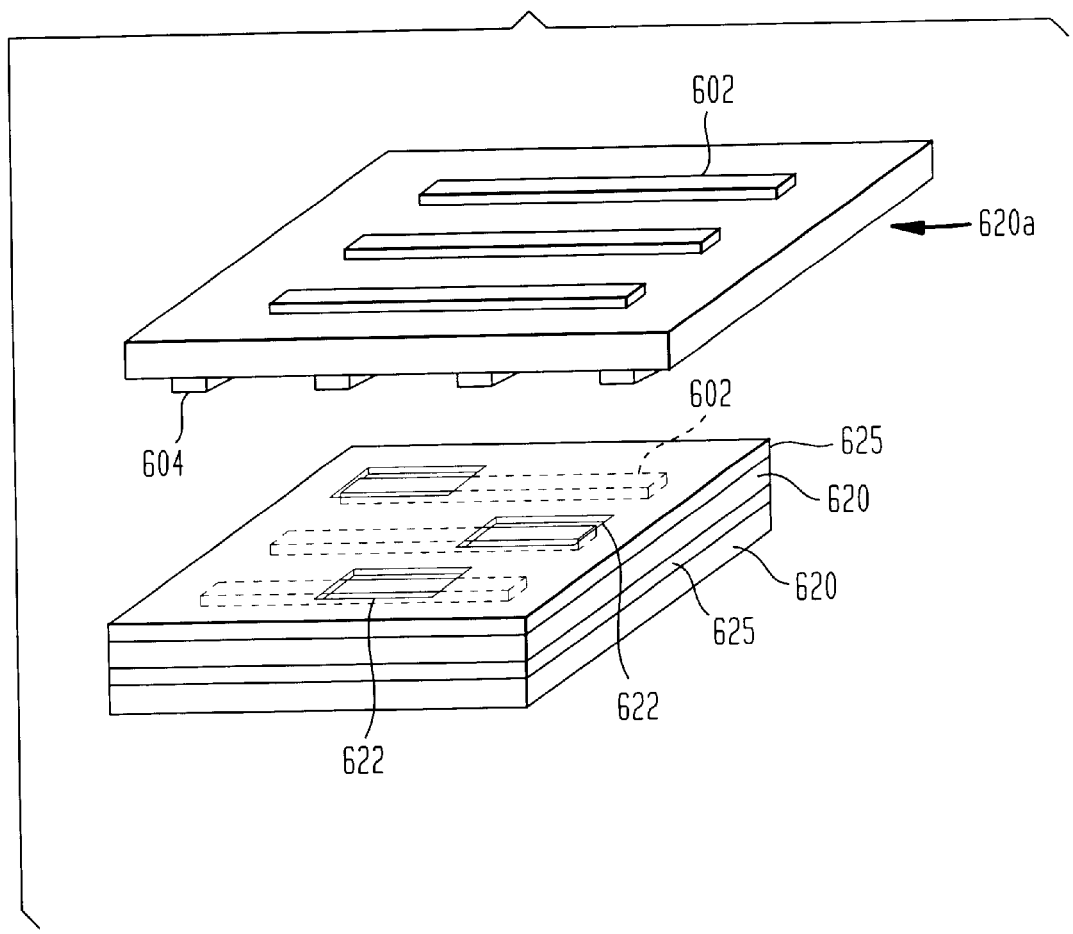
FIG. 12 is a diagrammatic, partially-exploded view depicting certain components during a process according to a further embodiment of the invention.

In a further variant, the chambers are formed by providing openings in adhesive layers, so that the adhesive layer itself serves as the dielectric element which cooperatively defines the chamber. Thus, the assembly shown in FIG. 12 includes several dielectric bodies 620. Each dielectric body includes traces 602 extending on its top surface and traces 604 extending on its bottom surface. Traces 602 on all bodies other than the topmost body 620a are provided with an evaporable conductive material over their entire surfaces. Adhesive layers 625 are provided on the top surfaces of the dielectric bodies other than the topmost body. These adhesive layers cover traces 602. Prior to laminating the layers, the adhesive is removed selectively to form holes 622 over traces 602 only at those locations where connections are to be formed. For example, the adhesive may be removed by laser ablation or by selective treatment with a solvent using a mask to protect areas which are not to be removed. The layers are then laminated. Adhesive layers 625 hold bodies 620 together, and insulate the traces 602 on the top of each dielectric layer from the traces 604 on the bottom surface of the next adjacent layer except at locations where holes are provided in the adhesive layers. Holes 622 in the adhesive layers form chambers between the bodies 620. The evaporable conductive material on traces 602 at holes 622 can be evaporated and deposited within these chambers to form conductive connections to the traces 604 in the same manner as discussed above. The holes formed in the adhesive layers may have any of the configurations discussed above, such as round holes or elongated slots.

Figure 13:
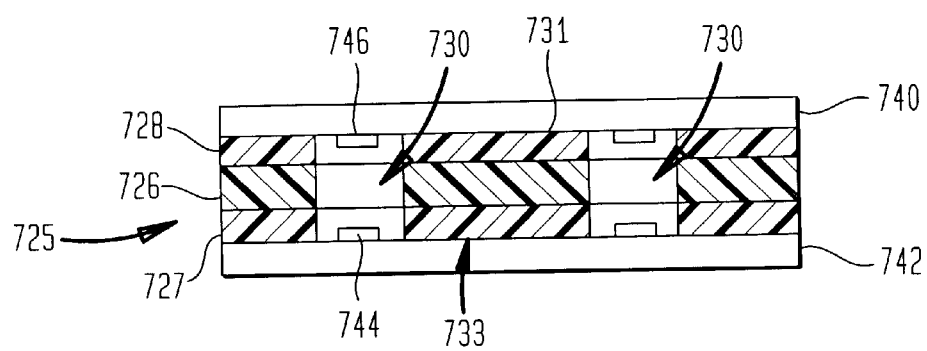
FIG. 13 is a diagrammatic sectional view depicting components used in a further embodiment of the invention.

In a further variant, the adhesive layers may be provided in separate, self-supporting elements, referred to herein as "interposers". Each such interposer may consist entirely of the adhesive. More typically, each interposer may include one or more sublayers such as structural reinforcements, electrically conductive elements or both, with the adhesive being disposed on opposite sides of the reinforcements. Merely by way of example, the interposers may include internal structures as shown in commonly assigned U.S. Pat. Nos. 5,367,764 and 5,282,312, the disclosure of which is hereby incorporated by reference herein. For example, an interposer 725 depicted in FIG. 13 includes a dielectric reinforcing layer 726 and layers of adhesive 727 and 728 on oppositely-facing top and bottom surfaces of the reinforcing layer, so that the adhesive layers define the first surface 731 and second surface 733 of the interposer. Holes 730 extend through all of these layers. Bodies 740 and 742 are laminated to the first and second surfaces, respectively, of the interposer. Conductive elements 744 on body 740 and conductive elements 746 on body 740 are aligned with holes 730 and thus exposed to the holes adjacent opposite ends of each hole. The conductive elements, bodies and interposer cooperatively define chambers in substantially the same manner as discussed above. A conductive material is provided within each such chamber, also in the same manner as discussed above. For example, one or both of the conductive elements may bear the conductive material. The conductive material is evaporated within the chambers as described above, so as to form electrical conductors extending between the conductive elements associated with each hole. In a further variant, the interposers may include metallic sheets having holes therein and dielectric material coated on the metallic sheets and lining the holes as disclosed, for example, in certain embodiments of U.S. Pat. No. 5,590,460 the disclosure of which is hereby incorporated by reference herein. The coating may be performed selectively so as to leave the conductive sheet uncoated in the interiors of at least some of the holes. Electrical connections to the conductive sheet will be formed when the conductive material is dispersed in such holes as discussed above with reference to hole 28b, FIG. 1.

In the processes discussed above, the conductive material is dispersed by conversion to a gaseous phase through application of heat, and deposited from the gaseous phase onto the walls of the holes so as to form the conductors. However, other methods of dispersing the conductive material within the chambers may be employed. For example, energy may be supplied to promote dispersion of the conductive material by application of an electromagnetic, acoustical or radiant energy as, for example, by inductive or microwave heating or a irradiation of the assembly with visible or infrared light or other radiant energy.

Mechanical energy in the form of ultrasonic or sonic vibration may be applied to the assembly, with or without separate heat input. Such sonic energy may cause evaporation of the conductive material, or may physically disperse the conductive material within the holes without evaporation. For example, the applied energy may be effective to convert the conductive material to a liquid phase, and to atomize the resulting liquid mass, thereby forming a mist of conductive material within each chamber. Even where a mist is not formed, the applied energy may move the liquid about within the chambers, thereby spreading the liquid within the chambers and onto the walls of the chambers. Mechanical energy also may be applied by vigorously shaking and/or tumbling the assembly. In the liquid-phase spreading processes, as well as in the evaporation processes discussed above, energy applied to the conductive material within the chambers is effective to spread the conductive material by mechanisms which do not rely on wetting of the interior surfaces of the chambers. In those embodiments where the conductive material can be spread as a liquid, evaporation of the conductive material is not essential. Therefore, the conductive material need not be evaporable. The term "dispersible conductive material" as used herein includes both evaporable conductive materials and materials which can be dispersed in the liquid phase by application of energy.

Figure 14:
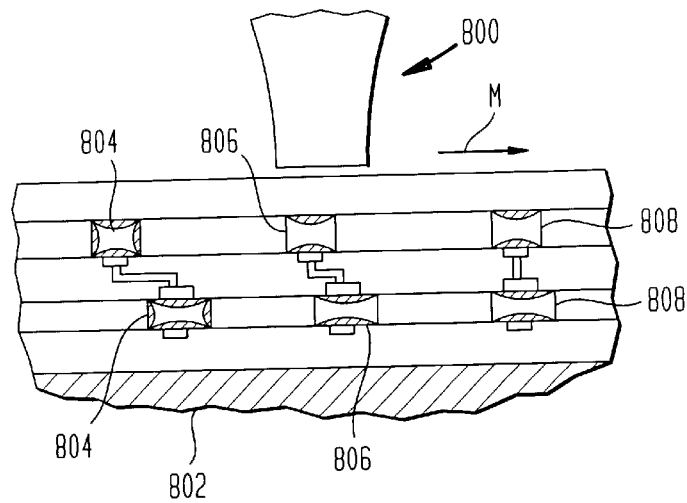
FIG. 14 is a fragmentary, diagrammatic sectional view depicting components and process equipment during a method according to yet another embodiment of the invention.
Figure 15:
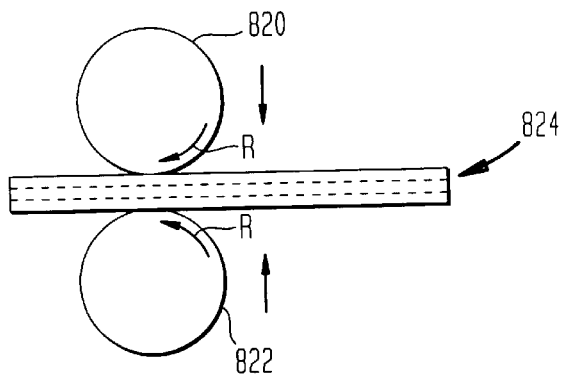
FIG. 15 is a diagrammatic elevational view depicting components and process equipment during a method according to a still further embodiment of the invention.

It is not essential to apply either mechanical energy or heat to the entire assembly at the same time. For example, as shown in FIG. 14, an ultrasonic energy applicator 800 driven by a conventional ultrasonic vibration source (not shown) is swept in a direction of movement M across one surface of the assembly while the opposite surface is supported on a support 802. The applicator thus applies ultrasonic energy to various sections of the assembly seriatim, so that conductors are formed in different holes at different times. In the position shown, conductors have already been formed in holes 804; conductors are being formed in holes 806; and conductors have yet to be formed in holes 808. A localized heating device or a beam of radiant energy can be swept over the assembly in the same way. Also, more complex sweep patterns such as raster scanning with or without momentary dwell at locations where the energy is directed onto holes may be employed. The relative motion between the energy applicator and the assembly may be imparted by motion of the assembly, by motion of the applicator, or both. For example, as seen in FIG. 15, heat, ultrasound or other energy may be applied through a pair of rollers 822 which cooperatively define a nip therebetween. The assembly is advanced through the nip by rotation of the rollers as indicated by arrows R. The rollers apply pressure on the surfaces of the assembly, and also apply energy to the region of the assembly which is momentarily disposed between the rollers.

In the embodiments discussed above, the dispersible conductive material is provided in the form of a metal and does not change composition during the process. However, a conductive material may be provided within the closed chambers by providing one or more materials which decompose or otherwise react to yield a metal or other conductive material which disperses within the chamber and deposits on the walls of the chamber. The term "conductive material precursor" is used in this disclosure to refer to such materials. A conductive material precursor may be provided as a single component or as multiple components which are mixed with one another within the chambers. Some conductive material precursors include, for example, metal hydrides, metal azides and metal acetates. The reaction may occur in the vapor phase or in a liquid phase.

Figure 16:
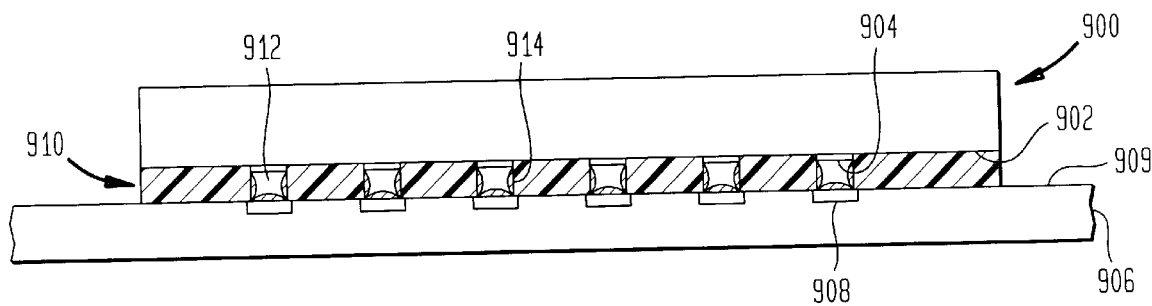
FIG. 16 is a fragmentary, partially sectional elevational view depicting an assembly according to another embodiment of the invention.

In the embodiment discussed above with reference to FIGS. 8 and 9, a semiconductor device such as a chip or wafer is connected to another element through leads. In a further variant, the invention can be employed to make connections between a semiconductor device and another element without the use of leads. As shown in FIG. 16, a semiconductor device 900 such as a chip or wafer having a front surface 902 and contacts 904 on such front surface is mounted to a substrate 906 having contact pads 908 on a top surface 909. Device 900 is mounted to the substrate by a dielectric layer 910 having holes 912 therein. The front face 902 of the semiconductor device faces toward the top surface 909 of the substrate. The holes 912 are aligned with contacts 904 and pads 908. Dielectric layer 910 may include adhesives, and may be provided in any of the ways discussed above. For example, the layer may be applied as a coating on the device or on the substrate, and holes 912 may be formed in registration with the contacts or pads. Here again, when the parts are assembled, the holes form chambers with conductive elements exposed therein. A dispersible conductive material or a conductive material precursor is provided within each chamber, and energy is applied so as to disperse the conductive material or react the precursor and thereby deposit conductive material on the interiors of holes 912 and form conductors 914 extending between contacts 904 and pads 908.

As these and other variations and combinations of the features discussed above can be utilized without departing from the invention, the foregoing description of the preferred embodiments should be taken by way of illustration rather than by way of limitation of the invention as defined by the claims.

What is claimed is:

1. A method of making connections in a microelectronic unit comprising:
   (a) providing first and second conductive elements and a dielectric, said dielectric and said conductive elements cooperatively defining a closed chamber;
   (b) providing a conductive material within said chamber; and
   (c) after steps (a) and (b) dispersing said conductive material within said closed chamber defined by said conductive elements and said dielectric so that said conductive material deposits on said dielectric within said closed chamber and said deposited conductive material connects said conductive elements to one another.

2. A method as claimed in claim 1 wherein said dispersing step includes evaporating said conductive material.

3. A method as claimed in claim 2 wherein said chamber is maintained under subatmospheric pressure during said evaporating step.

4. A method as claimed in claim 2 or claim 3 wherein said chamber contains an inert gas during said evaporating step.

5. A method as claimed in claim 3 wherein said dielectric and said conductive elements maintain said chamber under said subatmospheric pressure during said evaporating step.

6. A method as claimed in claim 3 wherein said dielectric and said conductive elements are maintained in a process fixture at subatmospheric pressure during said evaporating step.

7. A method as claimed in claim 1 wherein said dispersing step includes applying mechanical energy to spread the conductive material in a liquid phase within said chamber.

8. A method as claimed in claim 7 wherein said mechanical energy is effective to atomize the conductive material.

9. A method as claimed in claim 1 wherein said step of providing a conductive material within said chamber includes the step of providing a conductive material precursor and reacting said conductive material precursor within said chamber.

10. A method as claimed in claim 1 wherein said step of providing said first and second conductive elements and a dielectric includes providing a dielectric layer having oppositely-directed first and second surfaces and having a hole extending through the layer between said surfaces, and providing said first and second conductive elements exposed to said hole adjacent said first and second surfaces, respectively.

11. A method as claimed in claim 10 wherein said step of providing said first and second conductive elements includes providing first and second bodies bearing said first and second conductive elements and laminating said first and second bodies to said dielectric layer.

12. A method as claimed in claim 10 wherein said hole has a minimum cross-sectional dimension of about 60 $\mu$m.

13. A method as claimed in claim 12 wherein said minimum cross-sectional dimension is about 25 $\mu$m or less.

14. A method as claimed in claim 12 wherein said hole is of circular cross-sectional shape.

15. A method as claimed in claim 1 wherein said conductive material is provided on at least one of said conductive elements.

16. A method as claimed in claim 1 wherein said conductive elements are provided with substantially oxide-free metallic surfaces.

17. A method as claimed in claim 1 wherein said dispersing step includes applying heat to said conductive elements and dielectric element.

18. A method of forming a plurality of electrical connections comprising the steps of:
   (a) providing a first dielectric layer having first and second surfaces and having a plurality of holes extending through the layer between said first and second surfaces;
   (b) providing a plurality of first conductive elements adjacent the first surface of the layer and providing a plurality of second conductive elements adjacent the second surface of the layer, said conductive elements covering at least some of said holes so that at least some of said holes have first and second conductive elements covering said holes at said first and second surfaces;
   (c) providing a conductive material in at least some of the holes covered by said first and second conductive elements, and
   (d) after steps (a), (b) and (c), dispersing said conductive material within said covered holes so as to form conductors interconnecting the first and second conductive elements covering at least some of said holes.

19. A method as claimed in claim 18 wherein said step of providing first conductive elements includes providing a first body having conductive elements, said first body being juxtaposed with said dielectric layer.

20. A method as claimed in claim 19 wherein said step of providing said conductive material includes the step of depositing said conductive material on said first conductive elements.

21. A method as claimed in claim 20 wherein said step of depositing said conductive material includes one or more techniques selected from the group consisting of electroplating, electroless plating, sputtering, evaporation and chemical vapor deposition.

22. A method as claimed in claim 19 wherein said step of providing said dielectric layer includes forming said dielectric layer in place on a surface of said first body.

23. A method as claimed in claim 19 wherein said first body is a microelectronic element having contacts on a front surface, said first surface of said dielectric layer confronting said front surface.

24. A method as claimed in claim 23 wherein said step of providing said dielectric layer includes applying a curable adhesive to said front surface and applying a preformed dielectric layer over said adhesive.

25. A method as claimed in claim 23 wherein said second conductive elements include elongated conductors having fixed ends and free ends, said fixed ends covering at least some of said holes.

26. A method as claimed in claim 25 wherein said free ends of said elongated conductors are displaceable relative to dielectric layer.

27. A method as claimed in claim 26 further comprising connecting a second microelectronic element to said free ends of said elongated conductors and moving said second microelectronic element away from said dielectric layer to thereby deform the conductors.

28. A method as claimed in claim 25 wherein said dielectric layer includes elongated lead regions having fixed ends and having free ends displaceable with respect to the remainder of the dielectric layer, at least some of said elongated conductors extending along said elongated lead regions, so that the free end of each such elongated conductor is disposed adjacent the free end of an associated lead region of the dielectric layer.

29. A method as claimed in claim 28 further comprising the step of connecting a second microelectronic element to said free ends of said elongated conductors and moving the second microelectronic element away from the first microelectronic element to thereby deform the elongated conductors and the lead regions of the dielectric layer.

30. A method as claimed in claim 18 wherein at least one of said steps of providing first conductive elements, providing second conductive elements and providing conductive material is performed selectively, so that at least one of said first and second conductive elements and said conductive material is omitted at at least some of said holes, whereby no connection is made between first and second conductive elements at such holes.

31. A method as claimed in claim 18 wherein said step of providing said conductive material is performed selectively, so that said conductive material is omitted at at least some of said holes, whereby no connection is made between first and second conductive elements at such holes.

32. A method as claimed in claim 18 wherein said step of providing said first and second conductive elements is performed by providing a first body bearing said first conductive elements and a second body bearing said second conductive elements and sealing said first and second bodies to said first dielectric layer.

33. A method as claimed in claim 32 wherein said sealing step is performed while maintaining said dielectric layer under a subatmospheric pressure.

34. A method as claimed in claim 33 wherein said step of maintaining said dielectric layer under a subatmospheric pressure includes maintaining said dielectric layer in a gas consisting essentially of one or more inert gasses at said subatmospheric pressure.

35. A method as claimed in claim 18 wherein said dispersing step includes applying heat to said conductive elements and dielectric layer so as to evaporate the conductive material.

36. A method as claimed in claim 35 further comprising the step of testing said connections and repeating said heating step if any of said connections are defective.

37. A method of making a multilayer circuit comprising the steps of:

(a) providing a stacked structure including one or more dielectric layers and plural layers of conductive elements separated from one another by said one or more dielectric layers, at least some of said conductive elements in different layers being aligned with one another at one or more sites, said one or more dielectric layers having holes extending through them between the aligned conductive elements at at least some of said sites so that the holes are covered by the aligned conductive elements;

(b) providing a conductive material at at least some of said sites; and (c) after steps (a) and (b) dispersing said conductive material within said covered holes in said dielectric layers so as to spread the conductive material onto the walls of the covered holes in said dielectric layers to thereby form vertical connections between conductive elements at only those sites where (i) conductive elements are aligned with one another, and (ii) the dielectric layer between such conductive elements has a hole aligned with the conductive elements; and (iii) said conductive material is provided.

38. A method as claimed in claim 37 wherein said stacked structure includes a plurality of said dielectric layers and vertical conductors are formed in each of said dielectric layers.

39. A method as claimed in claim 37 wherein said step of providing said holes in said dielectric layers is performed selectively so that holes are provided at less than all of the sites having conductive elements on opposite sides of a dielectric layer.

40. A method as claimed in claim 37 wherein said step of providing holes is performed so as to place said holes at at least some locations of a regular grid pattern.

41. A method as claimed in claim 40 wherein said conductive elements in each said layer extend to less than all of said locations of said regular grid pattern.

42. A method as claimed in claim 40 wherein said layers of conductive elements include first direction and second direction layers arranged in alternating order, the conductive elements in each said first direction layer including elongated traces extending predominantly in an first horizontal direction, the conductive elements in each said second direction layer including elongated traces extending predominantly in a second horizontal direction transverse to said first horizontal direction.

43. A method as claimed in claim 42 wherein said holes in said regular grid pattern are provided at crossing points of said first direction and second direction traces.

44. A method as claimed in claim 38 wherein said step of providing said stacked structure is performed in a series of stacking operations with one or more dielectric layers, one or more conductive layers or both being added to the stacked structure in each such operation.

45. A method as claimed in claim 44 wherein said dispersing step is performed in a series of evaporating operations, at least some of said evaporating operations being performed before all of said stacking operations have been completed.

46. A method as claimed in claim 44 wherein said dispersing step is commenced after all of said stacking operations have been completed.

47. A method as claimed in claim 37 wherein said dispersing step includes evaporating said conductive material within said holes.

48. A method as claimed in claim 47 wherein said stacking operations include sealing said dielectric layers to one another while maintaining the stacked structure under subatmospheric pressure to thereby seal said holes under subatmospheric pressure.

49. A method as claimed in claim 37 wherein at least some of said dielectric layers include adhesive layers.

* * * * *

UNITED STATES PATENT AND TRADEMARK OFFICE
CERTIFICATE OF CORRECTION

PATENT NO. : 6,675,469 B1
DATED : January 13, 2004
INVENTOR(S) : Belgacem Haba and John W. Smith It is certified that error appears in the above-identified patent and that said Letters Patent is hereby corrected as shown below:

Title page,
Item [57], ABSTRACT,
Line 2, "opposite side of" should read -- opposite sides of --.

Column 2,
Line 1, "solutions to the" should read -- solutions to be --.
Line 52, "process" should read -- processes --.

Column 5,
Line 30, "and curing and curing" should read -- and curing --.
Line 39, "hole sin" should read -- holes in --.
Line 50, "adjacently free" should read -- adjacently the free --.
Line 62, "omitted at" should read -- omitted from at --.

Column 6,
Line 58, "at at lest" should read -- at at least --.

Column 7,
Line 11, "used n one" should read -- used in one --.

Column 10,
Line 60, "In a atmosphere" should read -- in an atmosphere --.

Column 11,
Line 47, "repeated add" should read -- repeated to add --.

Column 12,
Line 50, "Each holes" should read -- Each hole --.
Line 62, "layer stricture" should read -- layer structure --.

Column 15,
Line 62, "itself A further" should read -- itself. A further --.

Column 21,
Line 3, "to dielectric" should read -- to the dielectric --.

UNITED STATES PATENT AND TRADEMARK OFFICE
CERTIFICATE OF CORRECTION

PATENT NO. : 6,675,469 B1
DATED : January 13, 2004
INVENTOR(S) : Belgacem Haba and John W. Smith It is certified that error appears in the above-identified patent and that said Letters Patent is hereby corrected as shown below:

<u>Column 22,</u>
Line 34, "in an first" should read -- in a first --.

Signed and Sealed this

Fifteenth Day of June, 2004

JON W. DUDAS
*Acting Director of the United States Patent and Trademark Office*